(12) United States Patent
Aksyuk et al.

(10) Patent No.: US 7,733,200 B2
(45) Date of Patent: Jun. 8, 2010

(54) MEMS ACTUATOR

(75) Inventors: Vladimir Anatolyevich Aksyuk, Westfield, NJ (US); Flavio Pardo, New Providence, NJ (US); Maria Elina Simon, New Providence, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 112 days.

(21) Appl. No.: 11/904,949

(22) Filed: Sep. 29, 2007

(65) Prior Publication Data

US 2009/0085699 A1 Apr. 2, 2009

(51) Int. Cl.
*H01H 51/22* (2006.01)
(52) U.S. Cl. .................... 335/78; 200/181; 60/527
(58) Field of Classification Search ............ 335/78; 200/181; 60/527, 528; 310/307
See application file for complete search history.

(56) References Cited

U.S. PATENT DOCUMENTS

| | | | |
|---|---|---|---|
| 6,211,598 B1 | 4/2001 | Dhuler et al. | 310/307 |
| 6,407,478 B1 | 6/2002 | Wood et al. | 310/307 |
| 6,483,419 B1 | 11/2002 | Weaver et al. | 337/393 |
| 6,549,107 B2 | 4/2003 | Lim et al. | 335/78 |
| 6,708,491 B1 * | 3/2004 | Weaver et al. | 60/527 |
| 7,036,312 B2 | 5/2006 | Menard et al. | 60/527 |
| 7,471,184 B1 * | 12/2008 | Aksyuk et al. | 337/1 |
| 2005/0189204 A1 * | 9/2005 | Yeatman et al. | 200/181 |
| 2006/0238279 A1 * | 10/2006 | Lu et al. | 335/78 |
| 2007/0170811 A1 * | 7/2007 | Rubel | 310/307 |
| 2008/0061387 A1 | 3/2008 | Pardo | 257/414 |

OTHER PUBLICATIONS

Jan. 2004, Agrawal, Vivek, "A Latching MEMS Relay for DC and RF Applications," Proceedings of the 50th IEEE Holm Conference on Electrical Contacts and the $22^{nd}$ International Conference on Electrical Contacts, pp. 222-225.
Feb. 2002, "NANO SU-8 Negative Tone Photoresist Formulations 50-100", (Micro-Chem, 1254 Chestnut St., Newton, Mass.), pp. 1-4.
Jan. 2003, Qiu et al., "A High-Current Electrothermal Bistable MEMS Relay," MEMS-03 Kyoto, The $16^{th}$ Annual Int'l Conference on Micro Electro Mechanical Systems, pp. 64-67; and abstract.
Sep. 2004, Yeatman et al., "Performance and Analysis of Thermally Tripped MEMS Circuit Breakers," MicroMechanics Europe 2004, Leuven, Belgium, pp. 295-298.

(Continued)

*Primary Examiner*—Elvin G Enad
*Assistant Examiner*—Bernard Rojas
(74) *Attorney, Agent, or Firm*—The Law Office of Jay M. Brown

(57) ABSTRACT

Apparatus including substrate, pusher assembly, and flexor assembly adjacent to pusher assembly. Pusher assembly includes hot and cold pusher arms. First ends of hot and cold pusher arms are anchored over substrate. Second ends of hot and cold pusher arms are coupled together and suspended for lateral displacement over substrate. Flexor assembly includes flexor arm, and conductor having actuator contact. First end of flexor arm is anchored over substrate. Pusher assembly is configured for causing lateral displacement of second end of flexor arm and of actuator contact over the substrate. Method includes providing apparatus and causing pusher assembly to laterally displace second end of flexor arm and actuator contact over substrate.

20 Claims, 6 Drawing Sheets

OTHER PUBLICATIONS

2005, Siahmakoun, et al., "Variable Optical Delay Prototype Using a 2D Array of MEMS Mirrors," Optical MEMS and Their Applications Conference. IEEE/LEOS International Conference on Oulu, Finland, Aug. 1-4, 2005, Piscataway, NJ, USA, IEEE Aug. 1, 2005, pp. 55-56.

* cited by examiner

MEMS ACTUATOR

BACKGROUND OF THE INVENTION

1. Field of the Invention

This invention generally relates to micro-electromechanical actuators.

2. Related Art

Various types of micro-electromechanical actuators have been developed. Micro-electromechanical actuators are used, for example, to move parts of micro-electromechanical systems ("MEMS"). A micro-electromechanical actuator incorporating a conductor can be used to close an external electrical circuit, as an example. Many other end-use applications for micro-electromechanical actuators are known. Minimizing the size of micro-electromechanical actuators is often an important consideration in actuator design; but their robust performance and life-span durability can also be important. Balancing these competing factors is one challenge in MEMS actuator fabrication. There is a continuing need for new micro-electromechanical actuators offering durability, performance, and miniaturization that are suitable for including in MEMS and in end-application systems incorporating MEMS.

SUMMARY

In an example of an implementation, an apparatus is provided, including a micro-electromechanical actuator including a substrate, a pusher assembly, and a flexor assembly adjacent to the pusher assembly. The pusher assembly includes a hot pusher arm and a cold pusher arm. First ends of the hot and cold pusher arms are anchored over the substrate. Second ends of the hot and cold pusher arms are coupled together and suspended for lateral displacement over the substrate. The flexor assembly includes a flexor arm, and a conductor having an actuator contact. A first end of the flexor arm is anchored over the substrate. The pusher assembly is configured for causing lateral displacement of a second end of the flexor arm and the actuator contact over the substrate.

In another example of an implementation, a method is provided, that includes providing a micro-electromechanical actuator, the micro-electromechanical actuator having a substrate, a pusher assembly, and a flexor assembly adjacent to the pusher assembly. The pusher assembly includes a hot pusher arm and a cold pusher arm. First ends of the hot and cold pusher arms are anchored over the substrate. Second ends of the hot and cold pusher arms are coupled together and suspended for lateral displacement over the substrate. The flexor assembly includes a flexor arm, and a conductor having an actuator contact. A first end of the flexor arm is anchored over the substrate. The pusher assembly is configured for causing lateral displacement of a second end of the flexor arm and the actuator contact over the substrate. The method also includes causing the pusher assembly to laterally displace a second end of the flexor arm and the actuator contact over the substrate.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
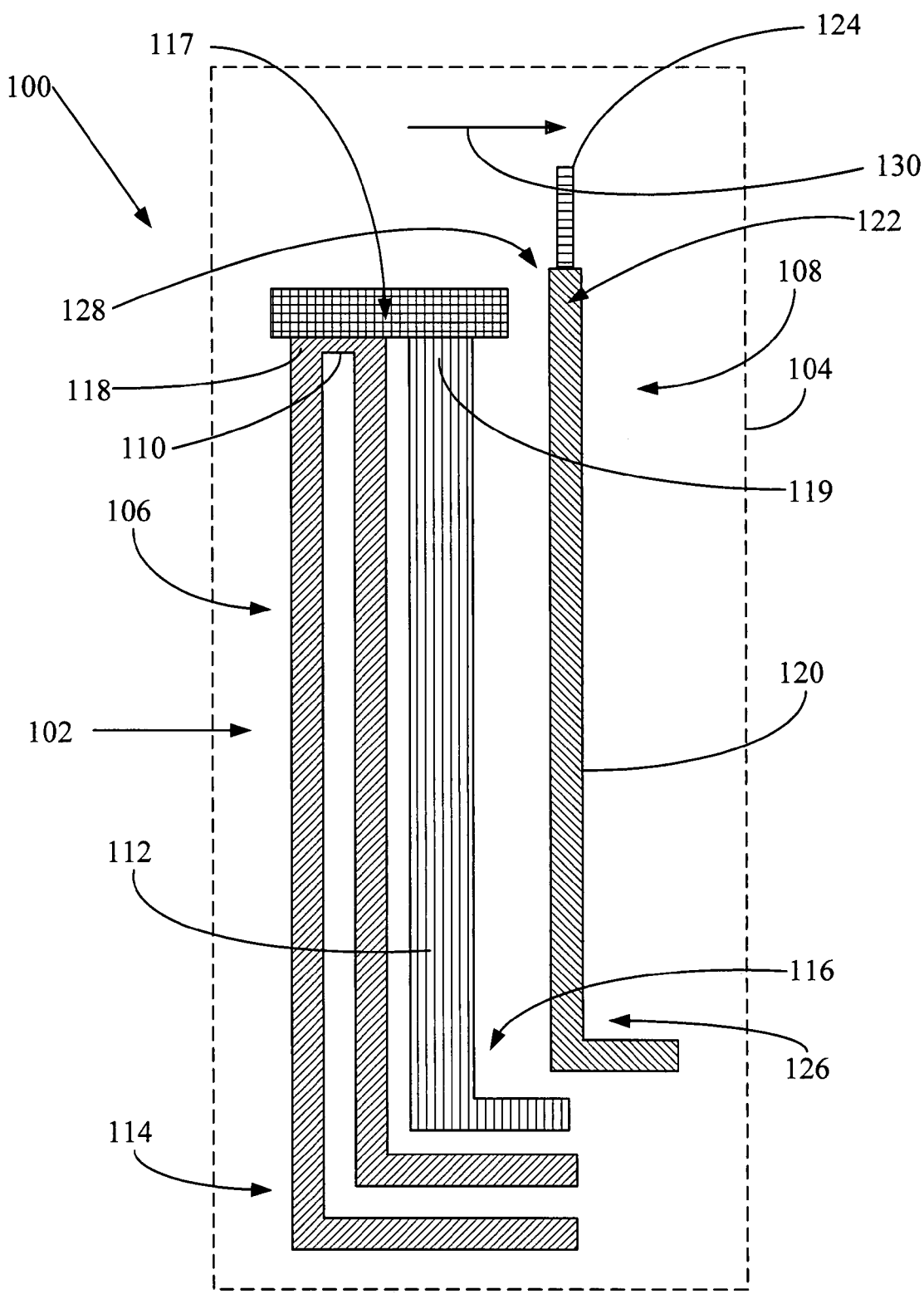
FIG. 1 is a top view showing an example of an implementation of an apparatus including a micro-electromechanical actuator.

FIG. 1 is a top view showing an example of an implementation of an apparatus 100 including a micro-electromechanical actuator 102. The micro-electromechanical actuator 102 includes a substrate 104, a pusher assembly 106, and a flexor assembly 108 adjacent to the pusher assembly 106. The pusher assembly 106 includes a hot pusher arm 110 and a cold pusher arm 112. A first end 114 of the hot pusher arm 110 and a first end 116 of the cold pusher arm 112, are anchored over the substrate 104. Second ends 118, 119 respectively of the hot and cold pusher arms 110, 112 are coupled together as schematically indicated at 117 and suspended for lateral displacement over the substrate 104. The flexor assembly 108 includes a flexor arm 120, and a conductor 122 having an actuator contact 124. A first end 126 of the flexor arm 120 is anchored over the substrate 104. The pusher assembly 106 is configured for causing lateral displacement in of a second end 128 of the flexor arm 120 and the actuator contact 124 over the substrate 104 in the general direction of the arrow 130. The dimensions and relative positions of the above-described elements of the apparatus 100 are examples, and it is understood that many variations are included. For example, the lengths and shapes of the hot and cold pusher arms 110, 112 and of the flexor arm 120, and their orientation relative to each other, may be varied. FIGS. 2-5 disclose further examples of apparatus 200, 300, 400, 500. The discussions of each one of the apparatus 100, 200, 300, 400, 500 in this specification are deemed incorporated in the discussions of all of the apparatus 100-500.

Figure 2:
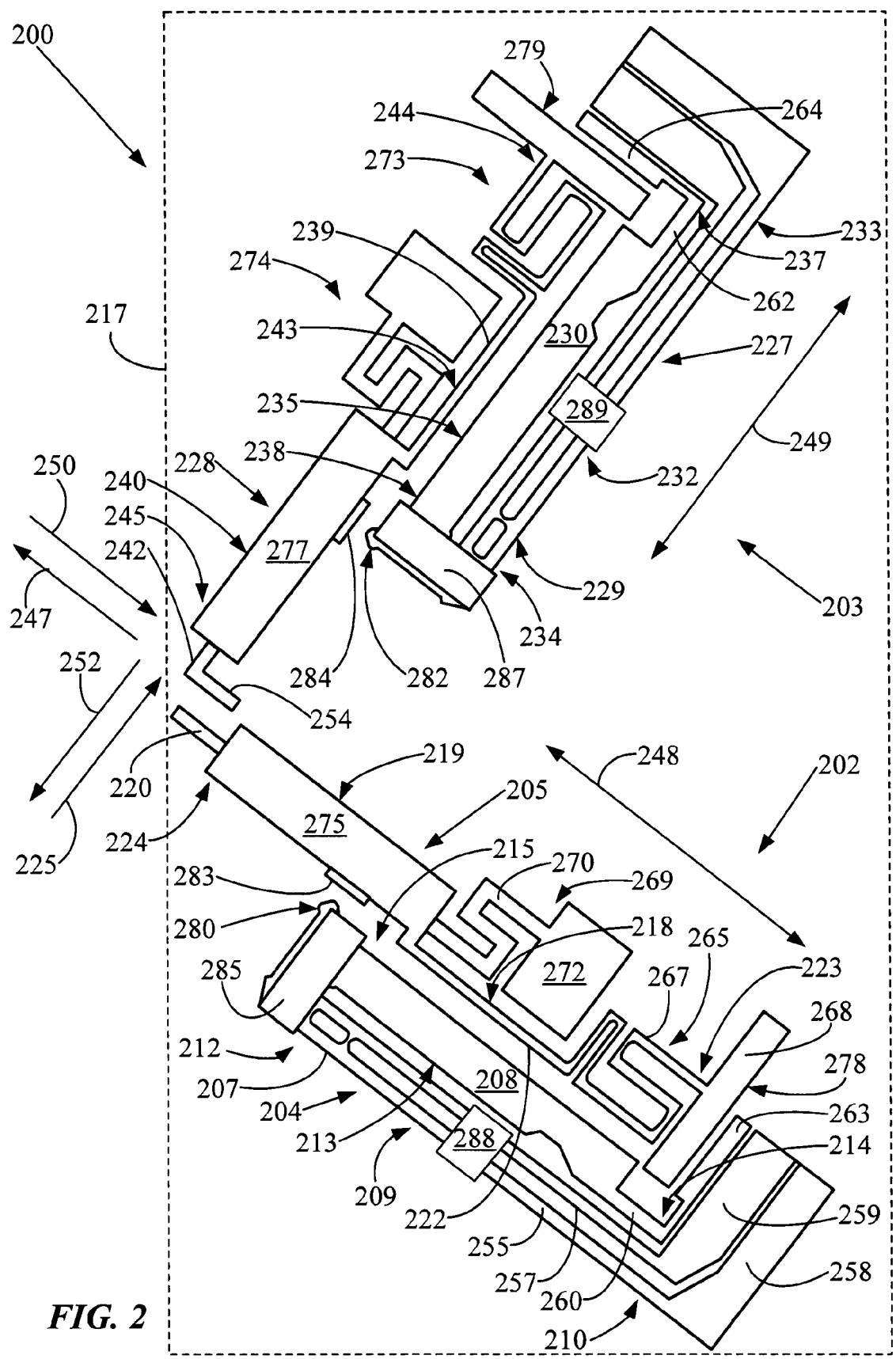
FIG. 2 is a top view showing another example of an implementation of an apparatus including a micro-electromechanical actuator and a second micro-electromechanical actuator.

FIG. 2 is a top view showing an example of an implementation of an apparatus 200 including a micro-electromechanical actuator 202 and a second micro-electromechanical actuator 203. The micro-electromechanical actuator 202 includes a pusher assembly 204, and a flexor assembly 205 adjacent to the pusher assembly 204. The pusher assembly 204 includes a hot pusher arm 207 and a cold pusher arm 208. The hot pusher arm 207 may have a first elongated region 209 between first and second ends 210, 212 of the hot pusher arm 207. The cold pusher arm 208 may have a second elongated region 213 between first and second ends 214, 215 of the cold pusher arm 208 and adjacent to the first elongated region 209. The first ends 210, 214 of the hot and cold pusher arms 207, 208 are anchored over a part of a substrate 217 indicated by a dotted line, for example by pads 258, 259, 263. Throughout this specification, the term "over" means that the subject element of a micro-electromechanical actuator 202, 203, such as a first end 210, 214 of the hot and cold pusher arms 207, 208, is in direct or indirect contact with another element, such as the substrate. The second ends 212, 215 of the hot and cold pusher arms 207, 208 are coupled together and suspended for lateral displacement over the substrate 217. As an example, the second ends 212, 215 of the hot and cold pusher arms 207, 208 may be substantially rigidly coupled together. In this regard, the hot and cold pusher arms 207, 208 may be constrained substantially to move together over the substrate. The flexor assembly 205 includes a flexor arm 218 and a conductor 219 having an actuator contact 220. The flexor arm 218 includes first and second ends 223, 224 of the flexor arm 218. In an example, the flexor arm 218 may include a third elongated region 222 between the first and second ends 223, 224 of the flexor arm 218. The first end 223 of the flexor arm 218 is anchored over the substrate 217, for example by the pad 268. The pusher assembly 204 is configured for causing lateral displacement in the direction of the arrow 225 of the second end 224 of the flexor arm 218 and of the actuator contact 220, over the substrate 217.

The second micro-electromechanical actuator 203 includes a second pusher assembly 227, and a second flexor assembly 228 adjacent to the second pusher assembly 227. The second pusher assembly 227 includes a second hot pusher arm 229 and a second cold pusher arm 230. The second hot pusher arm 229 may have a first elongated region 232 between first and second ends 233, 234 of the second hot pusher arm 229. The second cold pusher arm 230 may have a second elongated region 235 between first and second ends 237, 238 of the second cold pusher arm 230 and adjacent to the first elongated region 232. The first ends 233, 237 of the second hot and cold pusher arms 229, 230 are anchored over the substrate 217. The second ends 234, 238 of the second hot and cold pusher arms 229, 230 are coupled together and suspended for lateral displacement over the substrate 217. The second flexor assembly 228 includes a second flexor arm 239 and a second conductor 240 having a second actuator contact 242. The second flexor arm 239 includes first and second ends 244, 245 of the second flexor arm 239. In an example, the second flexor arm 239 may include a third elongated region 243 between the first and second ends 244, 245 of the second flexor arm 239. The first end 244 of the second flexor arm 239 is anchored over the substrate 217. The second pusher assembly 227 is configured for causing lateral displacement in the direction of the arrow 247 of the second end 245 of the second flexor arm 239 and of the second actuator contact 242, over the substrate 217. In an example, the actuator contact 242 may include a hook 254. As another example, the actuator contact 220 may include a hook (not shown) configured for latching with the actuator contact 242 or with the hook 254.

In an example of operation of the micro-electromechanical actuator 202, a length in the directions of the arrow 248 of the hot pusher arm 207 may be caused to increase relative to a length in the same directions of the cold pusher arm 208. The anchoring of the first ends 210, 214 of the hot and cold pusher arms 207, 208 over the substrate 217, and the coupling together of the second ends 212, 215 of the hot and cold pusher arms 207, 208 as shown in FIG. 2, may then generate a force that displaces the second ends 212, 215 in the direction of the arrow 225 when the length of the hot pusher arm 207 is so increased. The second ends 212, 215 of the hot and cold pusher arms 207, 208 may then together push the second end 224 of the flexor arm 218 and the actuator contact 220 in the direction of the arrow 225.

As an example of operation of the second micro-electromechanical actuator 203, a length in the directions of the arrow 249 of the second hot pusher arm 229 may be caused to increase relative to a length in the same directions of the second cold pusher arm 230. The anchoring of the first ends 233, 237 of the second hot and cold pusher arms 229, 230 over the substrate 217, and the coupling together of the second ends 234, 238 of the second hot and cold pusher arms 229, 230 as shown in FIG. 2 may then generate a force that displaces the second ends 234, 238 in the direction of the arrow 247 when the length of the second hot pusher arm 229 is so increased. The second ends 234, 238 of the second hot and cold pusher arms 229, 230 may then together push the second end 245 of the second flexor arm 239 and the second actuator contact 242 in the direction of the arrow 247.

In an example, the apparatus 200 may include relative placements of the micro-electromechanical actuators 202, 203 with the actuator contact 220 and the second actuator contact 242 being configured for latching together as part of a conductive path. The conductive path may, for example, be part of an external circuit (not shown). In this example, the apparatus 200 may be utilized, for example, as a locking micro-switch. The micro-electromechanical actuator 202 and the second micro-electromechanical actuator 203 of the apparatus 200 shown in FIG. 2 may, for example, be sequentially operated to latch together the actuator contact 220 and the second actuator contact 242. Relative positions of the micro-electromechanical actuator 202 and the second micro-electromechanical actuator 203 as shown in FIG. 2 may be, for example, resting positions of the actuators 202, 203. Such resting positions may, as an example, be relative positions assumed by the micro-electromechanical actuator 202 and the second micro-electromechanical actuator 203 over the substrate 217 when unlatched and without operation of either of the actuators 202, 203. For example, the resting positions of the micro-electromechanical actuator 202 and the second micro-electromechanical actuator 203 over the substrate 217 may be selected to place the second elongated regions 213, 235 of the respective cold pusher arms 208, 230, substantially in mutually orthogonal positions. Accordingly, the second elongated regions 213, 235 may respectively be parallel to directions defined by the arrows 248, 249, respectively, and the directions of the arrows 248, 249 may substantially be mutually orthogonal. In further examples, resting positions of the second elongated regions 213, 235 of the respective cold pusher arms 208, 230 may form angles of less or more than about 90 degrees, provided that latching and unlatching of the actuator contacts 220, 242 may be carried out.

As an example of sequential latching operations, the second pusher assembly 227 of the second micro-electromechanical actuator 203 may be caused to apply a force to push the second end 245 of the second flexor arm 239 and the second actuator contact 242 in the direction of the arrow 247. Next, the pusher assembly 204 of the micro-electromechanical actuator 202 may be caused to apply a force to push the second end 224 of the flexor arm 218 and the actuator contact 220 in the direction of the arrow 225. The relative positions of the micro-electromechanical actuator 202 and the second micro-electromechanical actuator 203 over the substrate 217 following these two steps may be described as, for example, deflected positions (not shown) of the micro-electromechanical actuators 202, 203. The force causing the second pusher assembly 227 of the second micro-electromechanical actuator 203 to push the second end 245 of the second flexor arm 239 and the second actuator contact 242 in the direction of the arrow 247 may then be released, so that the second actuator contact 242 may be caused to move in the direction of the arrow 250. The force causing the pusher assembly 204 of the micro-electromechanical actuator 202 to push the second end 224 of the flexor arm 218 and the actuator contact 220 in the direction of the arrow 225 may then be released, so that the actuator contact 220 may be caused to move in the direction of the arrow 252. During release of the force on the actuator contact 220, the actuator contact 220 may engage the second actuator contact 242, preventing the actuator contact 220 from returning completely to its position shown in FIG. 2, and latching together the actuator contact 220 and second actuator contact 242. As an example, the hook 254 on the second actuator contact 242 may engage the actuator contact 220. Latching together of the actuator contact 220 and the second actuator contact 242 may, as an example, facilitate closure of an external electrical circuit (not shown). Such an external electrical circuit may be, as examples, a signal circuit or an electrical load circuit.

After the first and second actuator contacts 220, 242 are latched, the first and second pusher assemblies 204, 227 may be caused to move in the directions of the arrows 252, 250 away from the first and second flexor arms 218, 239, back to their resting positions shown in FIG. 2. For example, the length of the first elongated region 232 of the second hot pusher arm 229 may then be reduced relative to the length in the same directions of the second elongated region 235 of the second cold pusher arm 230. Likewise, the length of the first elongated region 209 of the first hot pusher arm 207 may be reduced relative to the length in the same directions of the second elongated region 213 of the first cold pusher arm 208. In this manner, the apparatus 200 may facilitate latching together of the actuator contact 220 and second actuator contact 242, while enabling the first and second pusher assemblies 204, 227 to freely move away from the first and second flexor arms 218, 239 in the directions of the arrows 252, 250 respectively to their resting positions. At the end of this example of a latching operation of the apparatus 200, the first and second pusher assemblies 204, 227 of the first and second micro-electromechanical actuators 202, 203 may be in their resting positions.

Latching together of the actuator contact 220 and the second actuator contact 242 may immobilize the first and second flexor arms 218, 239 in positions deflected away from their resting positions and under bending force in the directions of the arrows 225, 247 respectively. In an example, the first and second flexor arms 218, 239 may be "creep-resistant flexor arms" formed from a creep-resistant material, selected as resistant to permanent deformation ("mechanical creep") induced by sustained bending force in the directions of the arrows 225, 247 for an extended period. Since the apparatus 200 may enable the first and second pusher assemblies 204, 227 to move away from the first and second flexor arms 218, 239 after the latching operation, the first and second pusher assemblies 204, 227 may be formed of a material selected regardless of creep resistance. For example, the first and second pusher assemblies 204, 227 may be formed of a metal material that may be subject to creep, because movement of the first and second pusher assemblies 204, 227 to their resting positions away from the first and second flexor arms 218, 239 after the latching operation protects the first and second pusher assemblies 204, 227 from structural damage due to creep.

Throughout this specification, a "creep-resistant material" is defined as a material that can be utilized in forming a flexor arm 218, 239 of the apparatus 200 such that the flexor arm 218, 239 returns over at least about 80% of the distance to its resting position without application of external force to the flexor arm 218, 239, within one day after unlatching of the actuator contacts 220, 242 following a latched period at a deflection of 10 microns for thirty days at a temperature of about 75 degrees Celsius. Further, throughout this specification, the following materials are designated as creep-resistant materials: compositions including a silicon-containing material selected from crystalline silicon, polysilicon, silicon nitride, silicon carbide, silicon-germanium, and mixtures or a mixture including two or more of these materials.

The example of an apparatus 200 shown in FIG. 2 may include pusher assemblies 204, 227 and flexor assemblies 205, 228 in each of the micro-electromechanical actuator 202 and the second micro-electromechanical actuator 203, respectively. In another example, a micro-electromechanical actuator (not shown) not including the flexor assembly 205 and having instead an actuator contact on the pusher assembly 204 may be substituted in the apparatus 200 for the micro-electromechanical actuator 202. In a latching operation for that example, the micro-electromechanical actuator 202 may be configured so as to be fully returned to its resting position when the actuator contacts 220, 242 are latched together. As another example, resting positions of the micro-electromechanical actuators 202, 203 may be selected so that the flexor arms 218, 239 are under stress in directions of the arrows 225, 247 respectively when the actuator contacts 220, 242 are latched together. In that example, including flexor arms 218, 239 in both of the micro-electromechanical actuators 202, 203 may protect both of the pusher assemblies 204, 227 from structural damage due to creep when the actuator contacts 220, 242 are latched together.

In an end-utilization example, the apparatus 200 may be utilized as a latching micro-switch in a telecommunications network. For example, the apparatus 200 may be operated to latch together the actuator contacts 220, 242 to complete a telecommunication signal circuit. As an example, the apparatus 200 may be so utilized for remote-controlled configuration of a telecommunications circuit for an end-user. In this example, the micro-electromechanical actuators 202, 203 may be remotely energized to perform the above-described latching operation. The micro-switch may then remain latched for the duration of use of the telecommunications circuit by the end-user, which may be, for example, up to 15-20 years. In the meantime, the flexor arms 218, 239 in both of the micro-electromechanical actuators 202, 203 may protect both of the pusher assemblies 204, 227 from structural damage due to creep. Following an extended 15-20 year time period of circuit use, the apparatus 200 may again be operated to unlatch the actuator contacts 220, 242 and de-configure the telecommunications circuit.

In an example of a micro-electromechanical actuator 202, a first elongated region 209 of the hot pusher arm 207 may include two beams 255, 257 extending from conductive pads 258, 259 and electrically connected together at the second end 212 of the hot pusher arm 207. For example, the beams 255, 257 may be formed of an electrically conductive and resistive material having a positive coefficient of thermal expansion ("TCE"). The conductive pads 258, 259 may be connected to an external electrical circuit (not shown). The two beams 255, 257 may then form a conductive loop as part of the external electrical circuit. When the external electrical circuit is energized, the beams 255, 257 may become heated, resulting in expansion of the positive TCE material and causing an increased length of the hot pusher arm 207 in the directions of the arrow 248. In an example, an electrical control signal may be utilized to energize the external circuit for operating the micro-electromechanical actuator 202. In another example, the hot pusher arm 207 may be heated in another manner, such as by conduction of heat into the hot pusher arm 207. The term "hot pusher arm" as utilized throughout this specification denotes a pusher arm that is configured for controlled elongation relative to a cold pusher arm coupled to the hot pusher arm 207. The term "cold pusher arm" as utilized throughout this specification denotes a pusher arm so coupled to the hot pusher arm 207 and having a sufficiently rigid structure so that elongation of the hot pusher arm 207 results in deflection of the pusher assembly 204 in the direction of the arrow 225. The "hot pusher arm" may alternatively be referred to as a "primary pusher arm, configured for controlled elongation" and the "cold pusher arm" may alternatively be referred to as a "secondary pusher arm". The micro-electromechanical actuator 203 may include analogous structural elements and may be operated in an analogous manner.

The cold pusher arm 208 and the second cold pusher arm 230 may, for example, include rigid second elongated regions 213, 235 and flexible regions 260, 262 near pads 263, 264 anchoring the cold pusher arms 208, 230 to the substrate 217. With these examples of cold pusher arms 208, 230, the hot pusher arms 207, 229 may work against the cold pusher arms 208, 230 to move the pusher assemblies 204, 227 in directions of the arrows 225, 247. Since the conductors 219, 240 are included in external circuits (not shown) that may be completed by latching the actuator contacts 220, 242, the cold pusher arms 208, 230 need not be electrically conductive, but conductive cold pusher arms 208, 230 may be utilized.

In another example, the flexor arm 218 may further include a restoring element 265 configured to provide a restoring force for moving the second end 224 of the flexor arm 218 in the direction of the arrow 252 toward the pusher assembly 204. A "restoring element", as the term is used throughout this specification, may as examples include a spring, a beam, or another resilient deformable body. For example, the restoring element 265 may include a serpentine spring 267 connected to the flexor arm 218 and to a pad 268 anchoring the restoring element 265 to the substrate 217. As an additional example, the flexor arm 218 may include a restoring element 269 configured to provide an additional restoring force for assisting the restoring element 265 in moving the second end 224 of the flexor arm 218 in the direction of the arrow 252 toward the pusher assembly 204. For example, the restoring element 269 may include a serpentine spring 270 connected to the flexor arm 218 and to a pad 272 anchoring the restoring element 269 to the substrate 217. The second flexor arm 239 may, for example, likewise include a restoring element 273 configured to provide a restoring force for moving the second end 245 of the second flexor arm 239 in the direction of the arrow 250 toward the second pusher assembly 227. The second flexor arm 239 may, in an example, further include a second restoring element 274 configured to provide an additional restoring force for assisting the restoring element 273 in moving the second end of the second flexor arm 239 in the direction of the arrow 250 toward the second pusher assembly 227. As an example, the restoring elements 269, 274 may provide greater restoring force than may be provided respectively by the restoring elements 265, 273. The restoring elements 265, 269, 273, 274 may, for example as shown in FIG. 2, include meandering paths.

The conductor 219 and the second conductor 240 may, for example, respectively include conductive layers 275, 277 on the flexor arms 218, 239. The conductive layers 275, 277 may, as examples, be on all or on parts of one or more surfaces of the flexor arms 218, 239, and may alternatively or in addition include a conductive wire (not shown) in the flexor arms 218, 239. In an example, the restoring elements 265, 273 may be configured to provide less restoring force than the restoring elements 269, 274, so that the restoring elements 265, 273 may have adequate flexibility together with the conductive layers 275, 277. The conductive layers 275, 277 may, in an example, respectively be in electrical communication with the actuator contacts 220, 242; and may respectively be in electrical communication with conductive pads 278, 279. The conductive pads 278, 279 may, as an example, be in electrical communication with external circuits as earlier discussed (not shown).

The pusher assembly 204 and the second pusher assembly 227 may, as further examples, include friction-reducing tips 280, 282. The friction-reducing tip 280 may, for example, be aligned with the flexor arm 218, configured for contacting the flexor arm 218 when the pusher assembly 204 causes lateral displacement of the second end 224 of the flexor arm 218 in the direction of the arrow 225 over the substrate 217. Likewise, the friction-reducing tip 282 may, for example, be aligned with the second flexor arm 239, configured for contacting the second flexor arm 239 when the second pusher assembly 227 causes lateral displacement of the second end 245 of the second flexor arm 239 in the direction of the arrow 247 over the substrate 217.

In further examples, the flexor arm 218 and the second flexor arm 239 may respectively include friction-reducing plates 283, 284. The friction-reducing plate 283 may be, as an example, aligned for contacting the pusher assembly 204 when the pusher assembly 204 causes lateral displacement of the second end 224 of the flexor arm 218 over the substrate 217. Likewise, the friction-reducing plate 284 may be, as an example, aligned for contacting the second pusher assembly 227 when the second pusher assembly 227 causes lateral displacement of the second end 245 of the second flexor arm 239 over the substrate 217.

In an example (not shown), the first end 223 of the flexor arm 218 may be anchored over the substrate 217 at a different location relative to the pusher assembly 204. For example, the first end 223 of the flexor arm 218 may be moved to a different location over the substrate 217, relative to the example 200, in the direction of the arrow 225, or of the arrow 247, or of the arrow 225 and either the arrow 247 or 250. For example, the pad 268 may be positioned parallel with and over the arrow 248. Likewise, for example, the pad 272 may be positioned parallel with and over the arrow 248. As another example (not shown), the first end 244 of the second flexor arm 239 may be anchored in an analogous manner over the substrate 217 at a different location relative to the second pusher assembly 229.

The hot pusher arm 207 and the second hot pusher arm 229 may, as examples, include a conductive metal alloy having electrical resistance suitable for heating the hot pusher arms 207, 229 by passing a current through the hot pusher arms 207, 229 to thermally extend lengths of the hot pusher arms 207, 229. In an example, the hot pusher arms 207, 229 may be formed of a metal alloy including nickel.

The flexor arm 218 and the second flexor arm 239 may, as examples, include a flexible material having high resistance to incurring mechanical creep after being held in a bent position for a prolonged time period. As examples, the flexor arms 218, 239 may be formed of a silicon-containing material, such as crystalline silicon, polysilicon, silicon nitride, silicon carbide, silicon-germanium, or a mixture including two or more of these materials.

The second ends 212, 215 of the hot and cold pusher arms 207, 208 may be coupled together by embedding them in a dielectric end tether 285. Likewise, the second ends 234, 238 of the second hot and cold pusher arms 229, 230 may be coupled together by embedding them in a dielectric end tether 287. As a further example, the beams 255, 257 of the hot pusher arm 207 may be constrained to move in congruent paths by a dielectric tether plug 288. Likewise, beams of the second hot pusher arm 229 may be constrained to move in congruent paths by a dielectric tether plug 289. As examples, the dielectric end tethers 285, 287 and the dielectric tether plugs 288, 289 may be formed of a polyimide, benzocyclobutene ("BCB"), or a photosensitive epoxy composition such as NANO-SU8 which is commercially available from the MicroChem Corporation.

Dimensions of the micro-electromechanical actuators 202, 203 and of the apparatus 200 may be selected as suitable for forming the apparatus 200 as part of a microelectronic system. As examples, the apparatus 200 may be included in micro-electromechanical systems ("MEMS"), such MEMS including as examples, photonic and electronic switches, variable attenuators, tunable filters, and resettable circuit breakers. As an example, a length of a micro-electromechanical actuator 202, 203 in directions of the arrows 248, 249 respectively may be about several hundred microns; and a width of the micro-electromechanical actuator 202 in directions of the arrows 225, 252 or of the micro-electromechanical actuator 203 in directions of the arrows 247, 250 may be about several tens of microns.

The apparatus 200 may be formed, as an example, on a silicon-on-insulator ("SOI") wafer, including a silicon mechanical layer on a sacrificial buried oxide (BOX) layer on a silicon handle layer. Background information on processes for fabrication of micro-electromechanical actuators is disclosed in Pardo et al., U.S. patent application Ser. No. 11/519, 142, filed on Sep. 11, 2006, titled "Micro-Actuator and Locking Switch"; Wood et al., U.S. Pat. No. 6,407,478, issued Jun. 18, 2002 and titled "Switches and Switching Arrays that Use Micro-electromechanical Devices Having One or More Beam Members That Are Responsive to Temperature"; and Agrawal, Vivek, "A Latching MEMS Relay for DC and RF Applications", Proceedings of the $50^{th}$ IEEE Holm Conference on Electrical Contacts and the $22^{nd}$ International Conference on Electrical Contacts. The entireties of these three documents are hereby incorporated by reference in this specification.

Figure 3:
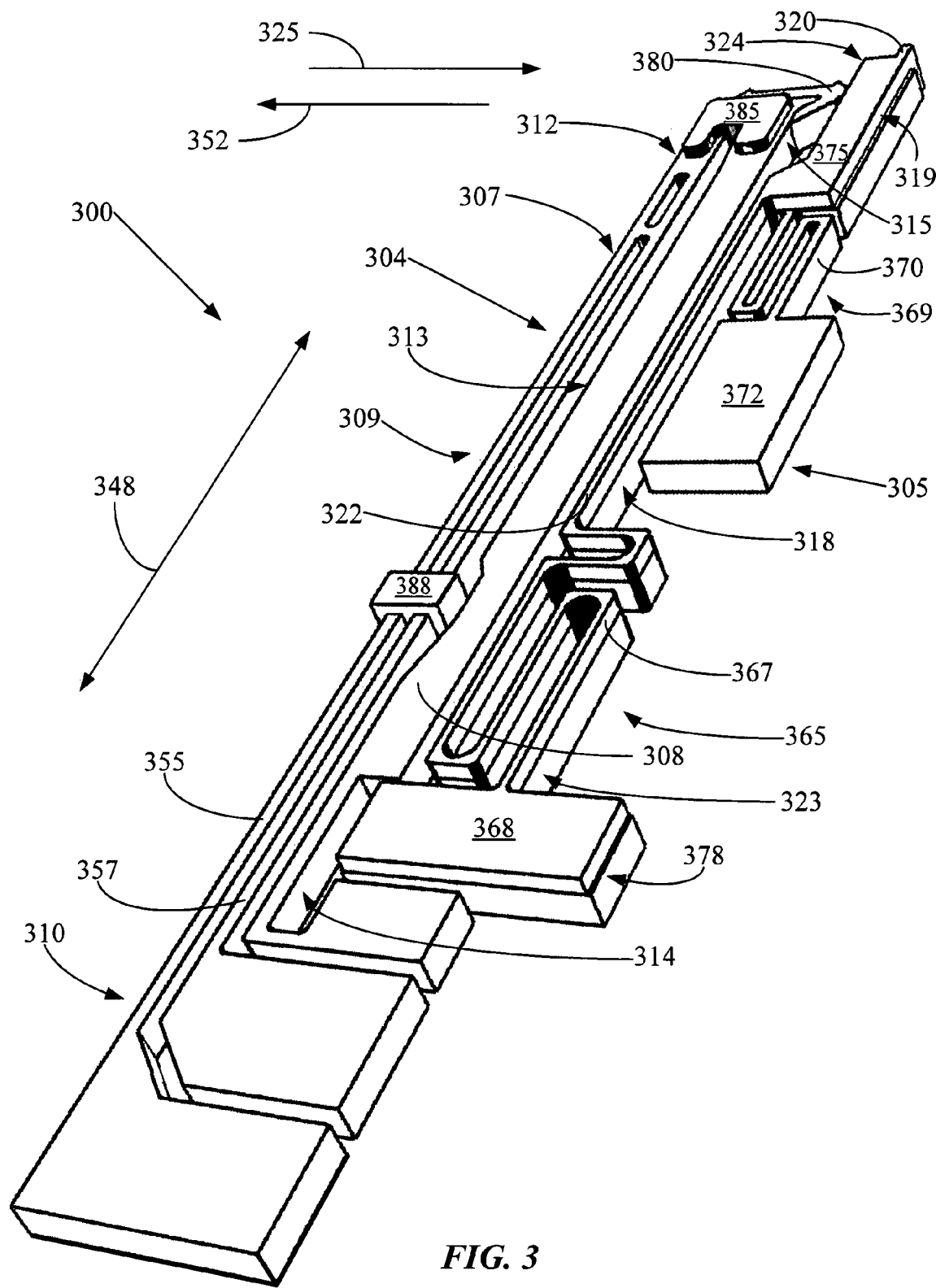
FIG. 3 is a perspective view showing an example of the micro-electromechanical actuator shown in FIG. 2.

FIG. 3 is a perspective view showing an example 300 of the micro-electromechanical actuator 202 shown in FIG. 2. The micro-electromechanical actuator 300 includes a pusher assembly 304, and a flexor assembly 305 adjacent to the pusher assembly 304. The pusher assembly 304 includes a hot pusher arm 307 and a cold pusher arm 308. The hot pusher arm 307 may have a first elongated region 309 extending in directions of the arrow 348 between first and second ends 310, 312 of the hot pusher arm 307. The cold pusher arm 308 may have a second elongated region 313 between first and second ends 314, 315 of the cold pusher arm 308 and adjacent to the first elongated region 309. The first ends 310, 314 of the hot and cold pusher arms 307, 308 are anchored over a substrate (not shown). The second ends 312, 315 of the hot and cold pusher arms 307, 308 are coupled together and suspended for lateral displacement over the substrate (not shown). The flexor assembly 305 includes a flexor arm 318 and a conductor 319 having an actuator contact 320. The flexor arm 318 includes first and second ends 323, 324 of the flexor arm 318. In an example, the flexor arm 318 may include a third elongated region 322 between the first and second ends 323, 324 of the flexor arm 318. The first end 323 of the flexor arm 318 is anchored over the substrate (not shown). The pusher assembly 304 is configured for causing lateral displacement in the direction of the arrow 325 of the second end 324 of the flexor arm 318 and of the actuator contact 320, over the substrate (not shown).

In another example, the flexor arm 318 may further include a restoring element 365 configured to provide a restoring force for moving the second end 324 of the flexor arm 318 in the direction of the arrow 352 toward the pusher assembly 304. For example, the restoring element 365 may include a serpentine spring 367 connected to the flexor arm 318 and to a pad 368 anchoring the restoring element 365 to the substrate (not shown). As an additional example, the flexor arm 318 may include a restoring element 369 configured to provide an additional restoring force for assisting the restoring element 365 in moving the second end 324 of the flexor arm 318 in the direction of the arrow 352 toward the pusher assembly 304. For example, the restoring element 369 may include a serpentine spring 370 connected to the flexor arm 318 and to a pad 372 anchoring the restoring element 369 to the substrate (not shown).

The conductor 319 may, for example, include a conductive layer 375 on the flexor arm 318. The conductive layer 375 may be in electrical communication with the actuator contact 320; and also may be in electrical communication with a conductive pad 378. The conductive pad 378 may, as an example, be in electrical communication with an external circuit as earlier discussed (not shown).

The pusher assembly 304 may, for example, include a friction-reducing tip 380. The friction-reducing tip 380 may, for example, be aligned with the second end 324 of the flexor arm 318, configured for contacting the second end 324 of the flexor arm 318 when the pusher assembly 304 causes lateral displacement of the second end 324 of the flexor arm 318 in the direction of the arrow 325 over the substrate (not shown). In a further example, the flexor arm 318 may include a friction-reducing plate (not shown). The friction-reducing plate (not shown) may be, as an example, aligned for contacting the pusher assembly 304 when the pusher assembly 304 causes lateral displacement of the second end 324 of the flexor arm 318 over the substrate (not shown).

The second ends 312, 315 of the hot and cold pusher arms 307, 308 may be coupled together by embedding them in a dielectric end tether 385. As a further example, the hot pusher arm 307 may include beams 355, 357. The beams 355, 357 may, for example, be constrained to move in congruent paths by a dielectric tether plug 388.

Figure 4:
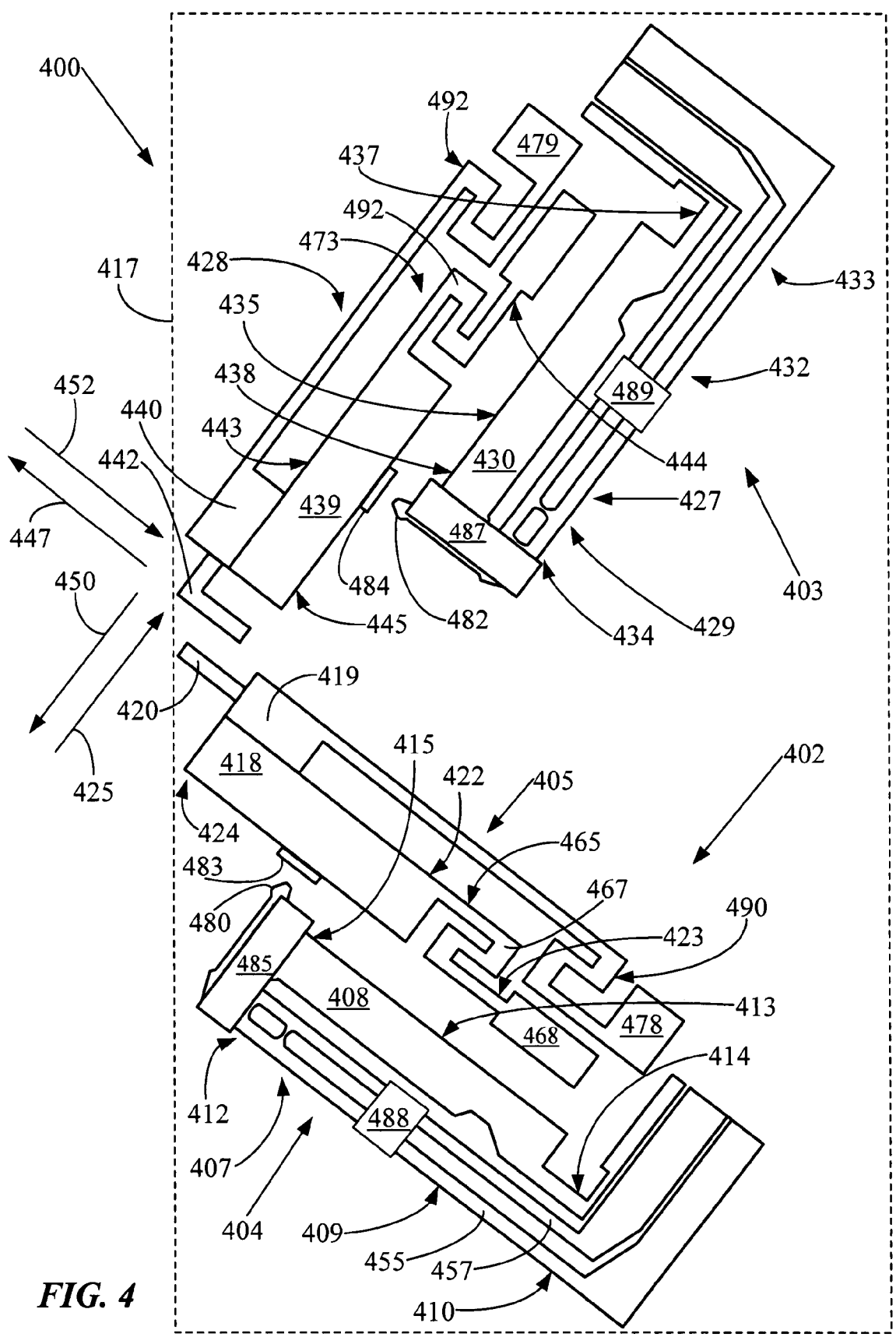
FIG. 4 is a top view showing another example of an implementation of an apparatus including a micro-electromechanical actuator and a second micro-electromechanical actuator.

FIG. 4 is a top view showing another example of an implementation of an apparatus 400 including a micro-electromechanical actuator 402 and a second micro-electromechanical actuator 403. The apparatus 400 substitutes conductors 419, 440 for the conductors 219, 240 discussed in connection with FIGS. 2-3; and substitutes flexor arms 418, 439 for the flexor arms 218, 239 discussed in connection with FIGS. 2-3. The entirety of the discussion of the apparatus 200 in this specification is accordingly relevant to discussion of the apparatus 400 and its operation, and is deemed incorporated here. Likewise, the entirety of this discussion of the apparatus 400 in this specification is accordingly relevant to and is deemed incorporated above in the discussion of the apparatus 200 and its operation.

The micro-electromechanical actuator 402 includes a pusher assembly 404, and a flexor assembly 405 adjacent to the pusher assembly 404. The pusher assembly 404 includes a hot pusher arm 407 and a cold pusher arm 408. The hot pusher arm 407 may have a first elongated region 409 between first and second ends 410, 412 of the hot pusher arm 407. The cold pusher arm 408 may have a second elongated region 413 between first and second ends 414, 415 of the cold pusher arm 408 and adjacent to the first elongated region 409. The first ends 410, 414 of the hot and cold pusher arms 407, 408 are anchored over a part of a substrate 417 indicated by a dotted line. The second ends 412, 415 of the hot and cold pusher arms 407, 408 are coupled together as shown in FIG. 4 and suspended for lateral displacement over the substrate 417. The flexor assembly 405 includes the flexor arm 418 and the conductor 419 having an actuator contact 420. The flexor arm 418 includes first and second ends 423, 424 of the flexor arm 418. In an example, the flexor arm 418 may include a third elongated region 422 between the first and second ends 423, 424 of the flexor arm 418. The first end 423 of the flexor arm 418 is anchored over the substrate 417. In an example, the flexor arm 418 may include a "creep resistant material" as discussed above in connection with FIGS. 2-3. The pusher assembly 404 is configured for causing lateral displacement in the direction of the arrow 425 of the second end 424 of the flexor arm 418 and of the conductor 419 having the actuator contact 420, over the substrate 417. The conductor 419 may, for example, be located adjacent to the flexor arm 418. The conductor 419 may, in an example, be in electrical communication with the actuator contact 420; and may be in electrical communication with a conductive pad 478.

The second micro-electromechanical actuator 403 includes a second pusher assembly 427, and a second flexor assembly 428 adjacent to the second pusher assembly 427. The second pusher assembly 427 includes a second hot pusher arm 429 and a second cold pusher arm 430. The second hot pusher arm 429 may have a first elongated region 432 between first and second ends 433, 434 of the second hot pusher arm 429. The second cold pusher arm 430 may have a second elongated region 435 between first and second ends 437, 438 of the second cold pusher arm 430 and adjacent to the first elongated region 432. The first ends 433, 437 of the second hot and cold pusher arms 429, 430 are anchored over the substrate 417. The second ends 434, 438 of the second hot and cold pusher arms 429, 430 are coupled together as shown in FIG. 4 and suspended for lateral displacement over the substrate 417. The second flexor assembly 428 includes the second flexor arm 439 and the second conductor 440 having a second actuator contact 442. The second flexor arm 439 includes first and second ends 444, 445 of the second flexor arm 439. In an example, the second flexor arm 439 may include a third elongated region 443 between the first and second ends 444, 445 of the second flexor arm 439. The first end 444 of the second flexor arm 439 is anchored over the substrate 417. In an example, the second flexor arm 439 may include a "creep resistant material" as discussed above in connection with FIGS. 2-3. The second pusher assembly 427 is configured for causing lateral displacement in the direction of the arrow 447 of the second end 445 of the second flexor arm 439 and of the second conductor 440 having the second actuator contact 442, over the substrate 417. The second conductor 440 may, for example, be located adjacent to the second flexor arm 440. The second conductor 440 may, in an example, be in electrical communication with the second actuator contact 442; and may be in electrical communication with a conductive pad 479.

In an example, the apparatus 400 may include relative placements of the micro-electromechanical actuators 402, 403 with the actuator contact 420 and the second actuator contact 442 being configured for latching together as part of a conductive path, in a manner analogous to that discussed earlier with regard to FIG. 2. The micro-electromechanical actuator 402 and the second micro-electromechanical actuator 403 of the apparatus 400 shown in FIG. 4 may, for example, be sequentially operated to latch together the actuator contact 420 and the second actuator contact 442. In examples, either or both of the flexor arm 418 and the second flexor arm 439 may be formed from a creep-resistant material. In an example, a micro-electromechanical actuator (not shown) not including the flexor assembly 405 may be substituted in the apparatus 400 for the micro-electromechanical actuator 402. As another example, resting positions (not shown) of the micro-electromechanical actuators 402, 403 may be selected so that the flexor arms 418, 439 are under stress in directions of the arrows 425, 447 respectively when the actuator contacts 420, 442 are latched together. In that example, including flexor arms 418, 439 in both of the micro-electromechanical actuators 402, 403 may protect both of the pusher assemblies 404, 427 from structural damage due to creep when the actuator contacts 420, 442 are latched together.

In another example, the flexor arm 418 may further include a restoring element 465 configured to provide a restoring force for moving the second end of the flexor arm 418 in the direction of the arrow 450 toward the pusher assembly 404. For example, the restoring element 465 may include a serpentine spring 467 integrated with the flexor arm 418 and connected to a pad 468 anchoring the restoring element 465 to the substrate 417. The second flexor arm 439 may, for example, likewise include a restoring element 473 configured to provide a restoring force for moving the second end of the second flexor arm 439 in the direction of the arrow 452 toward the second pusher assembly 427. As another example, the conductor 419 and the second conductor 440 may, for example, respectively include restoring elements 490, 492.

The pusher assembly 404 and the second pusher assembly 427 may, as further examples, include friction-reducing tips 480, 482. The friction-reducing tip 480 may, for example, be aligned with a point near the second end 424 of the flexor arm 418, configured for contacting the flexor arm 418 when the pusher assembly 404 causes lateral displacement of the second end 424 of the flexor arm 418 in the direction of the arrow 425 over the substrate 417. Likewise, the friction-reducing tip 482 may, for example, be aligned with a point near the second end 445 of the second flexor arm 439, configured for contacting the second flexor arm 439 when the second pusher assembly 427 causes lateral displacement of the second end 445 of the second flexor arm 439 in the direction of the arrow 447 over the substrate 417.

In further examples, the flexor arm 418 and the second flexor arm 439 may respectively include friction-reducing plates 483, 484. The friction-reducing plate 483 may be, as an example, aligned for contacting the pusher assembly 404 when the pusher assembly 404 causes lateral displacement of the second end 424 of the flexor arm 418 over the substrate 417. Likewise, the friction-reducing plate 484 may be, as an example, aligned for contacting the second pusher assembly 427 when the second pusher assembly 427 causes lateral displacement of the second end 445 of the second flexor arm 439 over the substrate 417.

The second ends 412, 415 of the hot and cold pusher arms 407, 408 may be coupled together by embedding them in a dielectric end tether 485. Likewise, the second ends 434, 438 of the second hot and cold pusher arms 429, 430 may be coupled together by embedding them in a dielectric end tether 487. As a further example, the hot pusher arm 407 may include beams 455, 457, and the beams 455, 457 may be constrained to move in congruent paths by a dielectric tether plug 488. Likewise, beams of the second hot pusher arm 429 may be constrained to move in congruent paths by a dielectric tether plug 489.

In an example (not shown), the first end 423 of the flexor arm 418 may be anchored over the substrate 417 at a different location relative to the pusher assembly 404, in a manner analogous to the discussion earlier regarding positioning of the first ends 223, 244 of first and second flexor arms 218, 239 shown in FIG. 2. As another example (not shown), the first end 444 of the second flexor arm 439 may be anchored in an analogous manner over the substrate 417 at a different location relative to the second pusher assembly 429.

Figure 5:
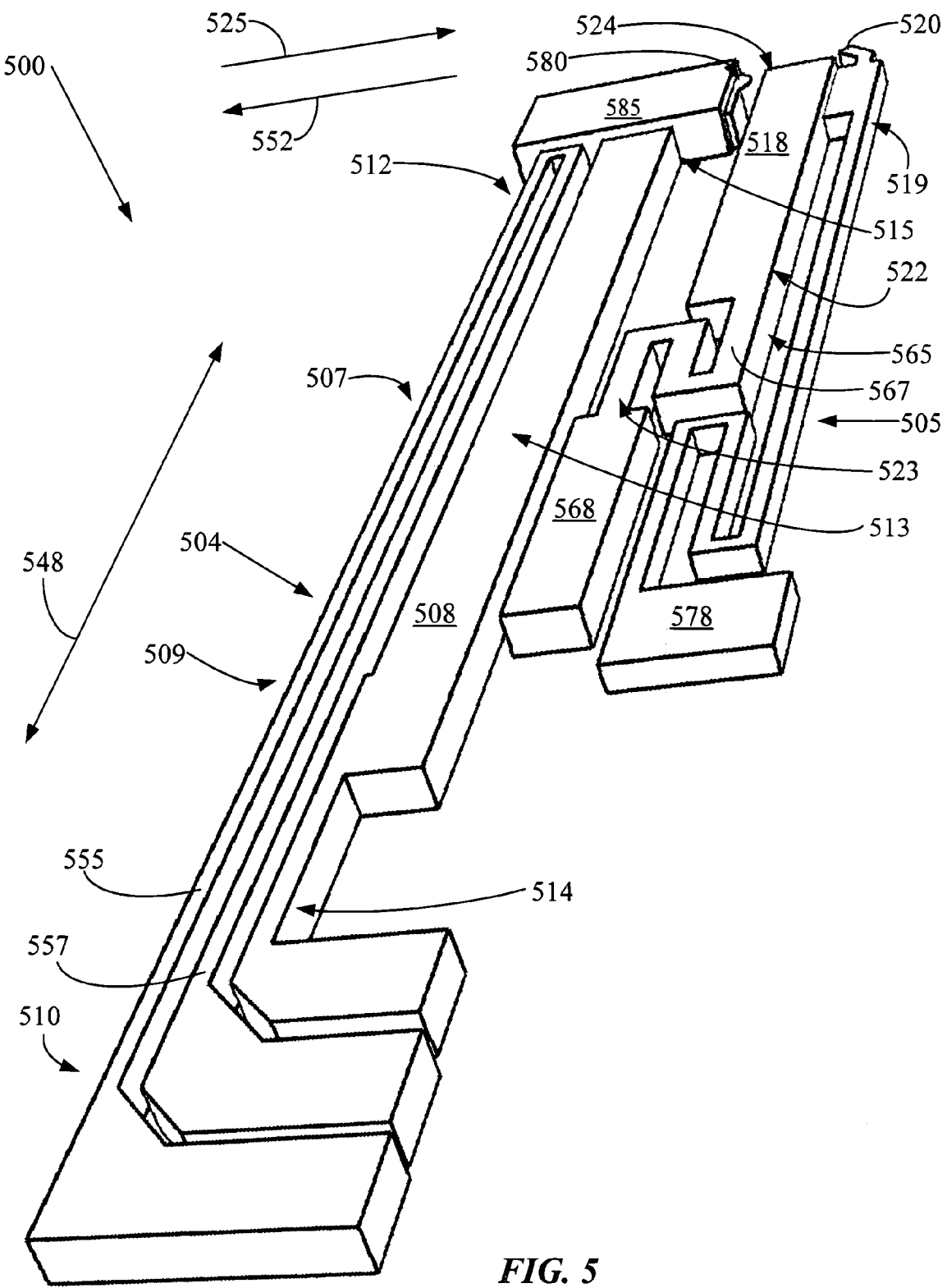
FIG. 5 is a perspective view showing an example of the micro-electromechanical actuator shown in FIG. 4.

FIG. 5 is a perspective view showing an example 500 of the micro-electromechanical actuator 402 shown in FIG. 4. The micro-electromechanical actuator 500 includes a pusher assembly 504, and a flexor assembly 505 adjacent to the pusher assembly 504. The pusher assembly 504 includes a hot pusher arm 507 and a cold pusher arm 508. The hot pusher arm 507 may have a first elongated region 509 extending in directions of the arrow 548 between first and second ends 510, 512 of the hot pusher arm 507. The cold pusher arm 508 may have a second elongated region 513 between first and second ends 514, 515 of the cold pusher arm 508 and adjacent to the first elongated region 509. The first ends 510, 514 of the hot and cold pusher arms 507, 508 are anchored over a substrate (not shown). The second ends 512, 515 of the hot and cold pusher arms 507, 508 are coupled together as shown in FIG. 5 and suspended for lateral displacement over the substrate (not shown). The flexor assembly 505 includes a flexor arm 518 and a conductor 519 having an actuator contact 520. The flexor arm 518 includes first and second ends 523, 524 of the flexor arm 518. In an example, the flexor arm 518 may include a third elongated region 522 between the first and second ends 523, 524 of the flexor arm 518. The first end 523 of the flexor arm 518 is anchored over the substrate (not shown). The pusher assembly 504 is configured for causing lateral displacement in the direction of the arrow 525 of the second end 524 of the flexor arm 518 and of the actuator contact 520, over the substrate (not shown).

In another example, the flexor arm 518 may further include a restoring element 565 configured to provide a restoring force for moving the second end 524 of the flexor arm 518 in the direction of the arrow 552 toward the pusher assembly 504. For example, the restoring element 565 may include a serpentine spring 567 integrated into flexor arm 518 and connected to a pad 568 anchoring the restoring element 565 to the substrate (not shown). The conductor 519 may, for example, be located adjacent to the flexor arm 518. The conductor 519 may, in an example, be in electrical communication with the actuator contact 520; and may be in electrical communication with a conductive pad 578.

The pusher assembly 504 may, for example, include a friction-reducing tip 580. The friction-reducing tip 580 may, for example, be aligned with the second end 524 of the flexor arm 518, configured for contacting the second end 524 of the flexor arm 518 when the pusher assembly 504 causes lateral displacement of the second end 524 of the flexor arm 518 in the direction of the arrow 525 over the substrate (not shown). In a further example, the flexor arm 518 may include a friction-reducing plate (not shown). The friction-reducing plate (not shown) may be, as an example, aligned for contacting the pusher assembly 504 when the pusher assembly 504 causes lateral displacement of the second end 524 of the flexor arm 518 over the substrate (not shown).

The second ends 512, 515 of the hot and cold pusher arms 507, 508 may be coupled together by embedding them in a dielectric end tether 585. As a further example, the hot pusher arm 507 may include beams 555, 557. The beams 555, 557 may, for example, be constrained to move in congruent paths by a dielectric tether plug (not shown).

Figure 6:
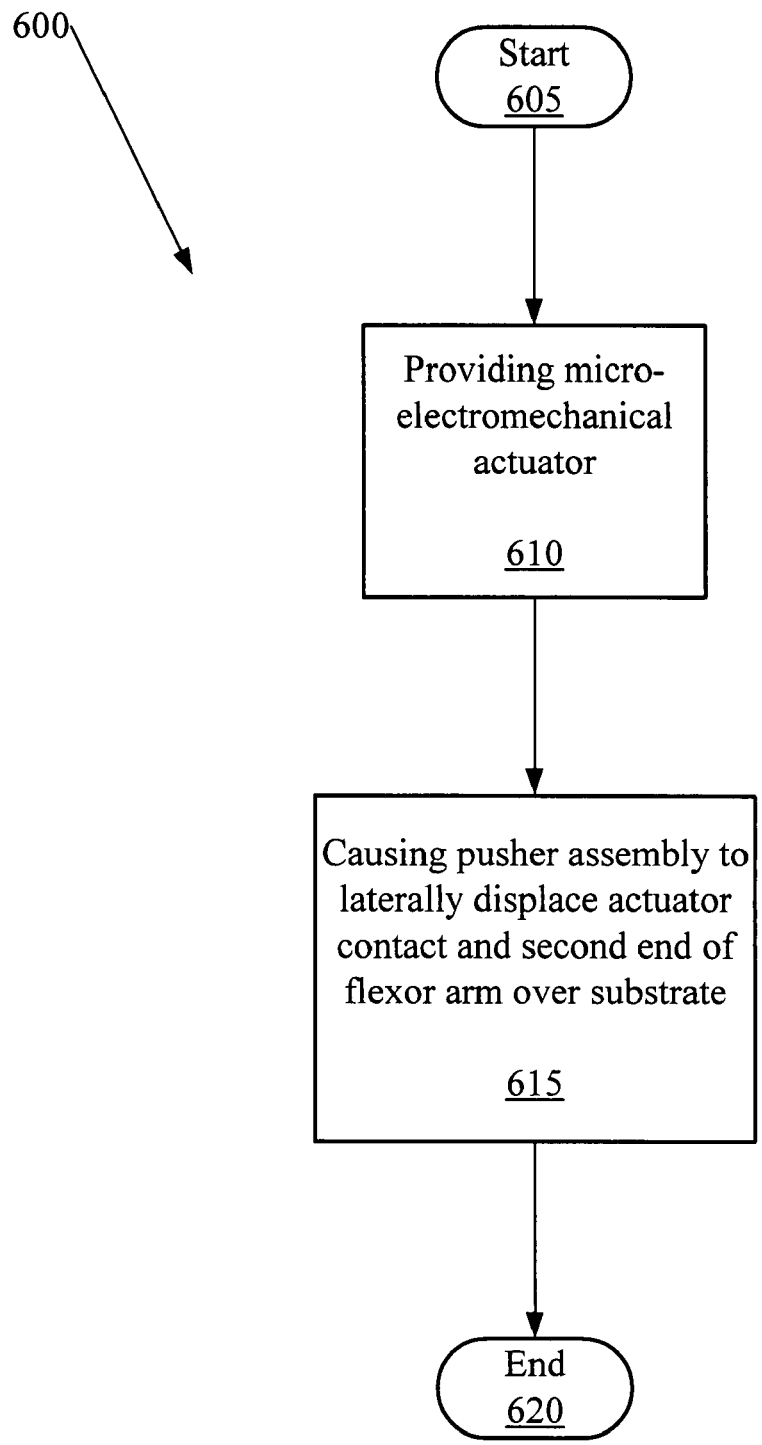
FIG. 6 is a flow chart showing an example of an implementation of a method.

FIG. 6 is a flow chart showing an example of an implementation of a method 600. The method may be utilized, for example, with the apparatus 100, 200, 300, 400, 500 discussed above. The following discussion makes reference to the apparatus 100, 200, 300, 400, 500 and to the elements of such apparatus in illustrating the method 600. The method 600 begins at step 605, and then at step 610 a micro-electromechanical actuator 102, 202, 203, 300, 402, 403, 500 is provided. The micro-electromechanical actuator so provided includes a pusher assembly 106, 204, 227, 304, 404, 427, 504, including a hot pusher arm 110, 207, 229, 307, 407, 429, 507 and a cold pusher arm 112, 208, 230, 308, 408, 430, 508, the hot pusher arm having first and second ends of the hot pusher arm, the cold pusher arm having first and second ends of the cold pusher arm, the first ends of the hot and cold pusher arms being anchored over a substrate 104, 217, (not shown), 417, (not shown) and the second ends of the hot and cold pusher arms being coupled together and suspended for lateral displacement over the substrate. The micro-electromechanical actuator further includes a flexor assembly 108, 205, 228, 305, 405, 428, 505 adjacent to the pusher assembly, the flexor assembly including a flexor arm 120, 218, 239, 318, 418, 439, 518 and including a conductor 122, 219, 240, 319, 419, 440, 519 having an actuator contact 124, 220, 242, 320, 420, 442, 520, the flexor arm including first and second ends of the flexor arm, the first end of the flexor arm being anchored over the substrate.

Next, at step 615, the pusher assembly 106, 204, 227, 304, 404, 427, 504 is caused to laterally displace a second end 128, 224, 245, 324, 424, 425, 524 of the flexor arm and the actuator contact over the substrate. The method may then end at step 620.

In another example, providing the flexor assembly in step 610 may include providing a restoring element 265, 273, 365, 465, 473, 565; and step 615 may include causing the restoring element to move the second end 224, 245, 324, 424, 425, 524 of the flexor arm toward the pusher assembly. As a further example, providing the pusher assembly in step 610 may include providing a friction-reducing tip 280, 282, 380, 480, 482, 580 aligned with the flexor arm; and step 615 may include causing the friction-reducing tip to contact the flexor arm when the pusher assembly is caused to laterally displace the second end of the flexor arm and the actuator contact over the substrate. As an additional example, providing the second end of the flexor arm in step 610 may include providing a friction-reducing plate 283, 284, 483, 484; and step 615 may include causing the friction-reducing plate to contact the pusher assembly when the pusher assembly is caused to laterally displace the second end of the flexor arm and the actuator contact over the substrate.

As an example, step 610 may include providing a second micro-electromechanical actuator 202, 203, 300, 402, 403, 500; and step 615 may include causing the second pusher assembly to laterally displace the second end of the second flexor arm and the second actuator contact over the substrate.

As another example where step 610 includes providing a second micro-electromechanical actuator, step 610 may further include providing a second restoring element; and step 615 may include causing the second restoring element to move the second end of the second flexor arm toward the second pusher assembly.

In a further example where step 610 includes providing a second micro-electromechanical actuator, step 615 may include causing the second pusher assembly 227, 427 to laterally displace the second end 245, 445 of the second flexor arm 239, 439 and the second actuator contact 242, 442 over the substrate; then causing the pusher assembly 204, 404 to laterally displace the second end 224, 424 of the flexor arm 218, 418 and the actuator contact 220, 420 over the substrate; then causing the second restoring element 273, 473 to move the second end 245, 445 of the second flexor arm 239, 439 toward the second pusher assembly 227, 427; and then causing the restoring element 265, 465 to move the second end 224, 424 of the flexor arm 218, 418 toward the pusher assembly 204, 404.

According to an additional example of the method 600 where step 610 includes providing a second micro-electromechanical actuator, step 615 may include causing the second ends 212, 215, 234, 238, 412, 415, 434, 438 of the first and second hot and cold pusher arms 207, 208, 229, 230, 407, 408, 429, 430 to move away from the second ends 224, 245, 424, 445 of the first and second flexor arms 218, 239, 418, 439 after causing the first and second pusher assemblies 204, 227, 404, 427 to laterally displace the second ends of the first and second flexor arms and the first and second actuator contacts 220, 242, 420, 442 over the substrate.

The apparatus 100, 200, 300, 400, 500 may, for example, be utilized as part of a micro-electromechanical system ("MEMS"). As examples, the apparatus 100, 200, 300, 400, 500 may be included in MEMS configured for end-utilization as photonic or electronic switches, variable attenuators, tunable filters, and resettable circuit breakers. Likewise, the method 600 may be utilized in connection with operating suitable micro-electromechanical actuators for MEMS. While the foregoing description refers in some instances to the apparatus 100, 200, 300, 400, 500, it is appreciated that the subject matter is not limited to these structures, nor to the structures discussed in the specification. Other shapes and configurations of apparatus may be fabricated. For example, arrays of micro-electromechanical actuators as described herein and shown in FIGS. 1-5 may be formed and operated individually or in an integrated manner. Likewise, the method 600 may be performed utilizing any apparatus including a suitable micro-electromechanical actuator, of which the micro-electromechanical actuators in the apparatus 100, 200, 300, 400, 500 are examples. Further, it is understood by those skilled in the art that the method 600 may include additional steps and modifications of the indicated steps.

Moreover, it will be understood that the foregoing description of numerous examples has been presented for purposes of illustration and description. This description is not exhaustive and does not limit the claimed invention to the precise forms disclosed. Modifications and variations are possible in light of the above description or may be acquired from practicing the invention. The claims and their equivalents define the scope of the invention.

What is claimed is:

1. An apparatus comprising:
    a micro-electromechanical actuator, including
        a substrate;
        a pusher assembly including a hot pusher arm and a cold pusher arm, first ends of the hot and cold pusher arms being anchored over the substrate and second ends of the hot and cold pusher arms being coupled together and suspended for lateral displacement over the substrate; and
        a flexor assembly adjacent to the pusher assembly, the flexor assembly including a flexor arm having a first end, a second end, and an elongated region between the first and second ends, the first end of the flexor arm being anchored over the substrate, the flexor arm including an actuator contact being spaced apart along the elongated region from the first end;
        the flexor arm including a conductor forming first conductive path extending between the actuator contact and the first end of the flexor arm along the elongated region, the first conductive path being laterally displaceable over the substrate and being part of an external electrical circuit.

2. The apparatus of claim 1, wherein the flexor assembly further includes a restoring element configured for moving the second end of the flexor arm toward the pusher assembly.

3. The apparatus of claim 2, wherein the restoring element is located adjacent to the flexor arm.

4. The apparatus of claim 2, wherein the restoring element includes a serpentine spring.

5. The apparatus of claim 1, wherein the flexor arm has a creep-resistant composition including crystalline silicon, polysilicon, silicon nitride, silicon carbide, silicon-germanium, or a combination including two or more of the foregoing.

6. The apparatus of claim 1, having an additional micro-electromechanical actuator, including:
    a second pusher assembly including a second hot pusher arm and a second cold pusher arm, first ends of the second hot and second cold pusher arms being anchored over the substrate and second ends of the second hot and second cold pusher arms being coupled together and suspended for lateral displacement over the substrate; and
    a second flexor assembly adjacent to the second pusher assembly, the second flexor assembly including a second flexor arm, the second flexor assembly having a first end, a second end, and a second elongated region between the first and second ends, the first end of the second flexor assembly being anchored over the substrate, the second flexor assembly including a second actuator contact being spaced apart along the second elongated region from the first end of the second flexor assembly;
    the second flexor assembly including a second conductor forming a second conductive path extending between the second actuator contact and the first end of the second flexor assembly along the second elongated region, the second conductive path being laterally displaceable over the substrate and being part of the external electrical circuit.

7. The apparatus of claim 6, wherein the actuator contact and the second actuator contact are configured for being latched together, and for interconnecting the first and second conductive paths.

8. A method, comprising:
    providing a micro-electromechanical actuator, including: a substrate; a pusher assembly including a hot pusher arm and a cold pusher arm, first ends of the hot and cold pusher arms being anchored over the substrate and second ends of the hot and cold pusher arms being coupled together and suspended for lateral displacement over the substrate; and a flexor assembly adjacent to the pusher assembly, the flexor assembly including a flexor arm having a first end, a second end, and an elongated region between the first and second ends, the first end of the flexor arm being anchored over the substrate, the flexor arm including an actuator contact being spaced apart along the elongated region from the first end, the flexor arm including a conductor forming a first conductive path extending between the actuator contact and the first end of the flexor arm along the elongated region, the first conductive path being part of an external electrical circuit; and
    causing the pusher assembly to laterally displace the first conductive path over the substrate.

9. The method of claim 8, wherein providing the micro-electromechanical actuator including the flexor assembly includes providing a restoring element and wherein the method includes causing the restoring element to move the second end of the flexor arm toward the pusher assembly.

10. The method of claim 8, including
    providing an additional micro-electromechanical actuator, including a second pusher assembly including a second hot pusher arm and a second cold pusher arm, first ends of the second hot and second cold pusher arms being anchored over the substrate and second ends of the second hot and second cold pusher arms being coupled together and suspended for lateral displacement over the substrate; and a second flexor assembly adjacent to the second pusher assembly, the second flexor assembly including a second flexor arm, the second flexor assembly having a first end, a second end, and a second elongated region between the first and second ends, the first end of the second flexor assembly being anchored over the substrate, the second flexor assembly including a second actuator contact being spaced apart along the second elongated region from the first end of the second flexor assembly, the second flexor assembly including a second conductor forming a second conductive path extending between the second actuator contact and the first end of the second flexor assembly along the second elongated region, the second conductive path being part of the external electrical circuit; and causing the second pusher assembly to laterally displace the second conductive path over the substrate.

11. The method of claim 10, wherein providing the additional micro-electromechanical actuator includes providing a second restoring element, and wherein the method includes causing the second restoring element to move the second end of the second flexor arm toward the second pusher assembly.

12. The method of claim 11, including causing the pusher assembly to laterally displace the second end of the flexor arm and the actuator contact over the substrate, then causing the second pusher assembly to laterally displace the second end of the second flexor arm and the second actuator contact over the substrate, then causing the restoring element to move the second end of the flexor arm toward the pusher assembly, and then causing the second restoring element to move the second end of the second flexor arm toward the second pusher assembly.

13. An apparatus comprising:
a micro-electromechanical actuator, including
a substrate;
a pusher assembly including a hot pusher arm and a cold pusher arm, first ends of the hot and cold pusher arms being anchored over the substrate and second ends of the hot and cold pusher antis being coupled together and suspended for lateral displacement over the substrate;
a flexor assembly adjacent to the pusher assembly, the flexor assembly including a flexor arm and a conductor arm, the conductor arm being adjacent to the flexor arm;
the flexor arm having a first end, a second end, and an elongated region between the first and second ends, the first end of the flexor arm being anchored over the substrate, and the second end of the flexor arm being laterally displaceable over the substrate;
the conductor arm having a first end, a second end, and an elongated region between the first and second ends, the first end of the conductor arm being anchored over the substrate, the conductor arm including an actuator contact being spaced apart along the elongated region from the first end, the conductor arm including a conductor forming a first conductive path extending between the actuator contact and the first end of the conductor arm along the elongated region of the conductor arm, the first conductive path being laterally displaceable over the substrate and being part of an external electrical circuit.

14. The apparatus of claim 13, wherein the flexor assembly further includes a restoring element configured for moving the second end of the flexor assembly toward the pusher assembly.

15. The apparatus of claim 14, wherein the restoring element is located in the flexor arm.

16. The apparatus of claim 14, wherein the restoring element includes a serpentine spring.

17. The apparatus of claim 13, wherein the flexor arm has a creep-resistant composition including crystalline silicon, polysilicon, silicon nitride, silicon carbide, silicon-germanium, or a combination including two or more of the foregoing.

18. The apparatus of claim 13, having an additional micro-electromechanical actuator, including a second pusher assembly including a second hot pusher arm and a second cold pusher arm, first ends of the second hot and second cold pusher arms being anchored over the substrate and second ends of the second hot and second cold pusher arms being coupled together and suspended for lateral displacement over the substrate; and a second flexor assembly adjacent to the second pusher assembly, the second flexor assembly including a second flexor arm, the second flexor assembly having a first end, a second end, and a second elongated region between the tint and second ends, the first end of the second flexor assembly being anchored over the substrate, the second flexor assembly including a second actuator contact being spaced apart along the second elongated region from the first end of the second flexor assembly, the second flexor assembly including a second conductor forming a second conductive path extending between the second actuator contact and the first end of the second flexor assembly along the second elongated region, the second conductive path being laterally displaceable over the substrate and being part of the external electrical circuit.

19. The apparatus of claim 18, wherein the actuator contact and the second actuator contact are configured for being latched together, and for interconnecting the first and second conductive paths.

20. A method, comprising:
providing a micro-electromechanical actuator, including: a substrate; a pusher assembly including a hot pusher arm and a cold pusher arm, first ends of the hot and cold pusher arms being anchored over the substrate and second ends of the hot and cold pusher arms being coupled together and suspended for lateral displacement over the substrate; a flexor assembly adjacent to the pusher assembly, the flexor assembly including a flexor arm and a conductor arm, the conductor arm being adjacent to the flexor arm; the flexor attn having a first end, a second end, and an elongated region between the first and second ends, the first end of the flexor arm being anchored over the substrate, and the second end of the flexor arm being laterally displaceable over the substrate; the conductor arm having a first end, a second end, and an elongated region between the first and second ends, the first end of the conductor arm being anchored over the substrate, the conductor arm including an actuator contact being spaced apart along the elongated region from the first end, the conductor arm including a conductor forming a first conductive path extending between to actuator contact and the first end of the conductor arm along the elongated region of the conductor arm, the first conductive path being part of an external electrical circuit; and
causing the pusher assembly to laterally displace the first conductive path over the substrate.

* * * * *